United States Patent
Yoo et al.

(10) Patent No.: US 7,952,861 B2
(45) Date of Patent: May 31, 2011

(54) DISPLAY APPARATUS, HEAT CONDUCTIVE ADHESIVE SHEET FOR DISPLAY APPARATUS, AND PROCESS FOR PREPARING THE SAME

(75) Inventors: Seung-Min Yoo, Cheongju-si (KR); Geun-Hee Lee, Cheongju-si (KR); Byoung-Soo Lee, Seoul (KR); Se-Jin Shin, Incheon-si (KR); Ik-Hwan Cho, Busan (KR); Jang-Soon Kim, Daejeon Metropolitan (KR); Byeong-Gyu Cho, Daejeon Metropolitan (KR); Min-Seok Song, Jinju-si (KR)

(73) Assignee: LG Chem, Ltd., Seoul (KR)

( * ) Notice: Subject to any disclaimer, the term of this patent is extended or adjusted under 35 U.S.C. 154(b) by 200 days.

(21) Appl. No.: 12/224,163

(22) PCT Filed: Feb. 23, 2007

(86) PCT No.: PCT/KR2007/000960
§ 371 (c)(1),
(2), (4) Date: Aug. 20, 2008

(87) PCT Pub. No.: WO2007/097592
PCT Pub. Date: Aug. 30, 2007

(65) Prior Publication Data
US 2009/0059489 A1  Mar. 5, 2009

(30) Foreign Application Priority Data
Feb. 23, 2006  (KR) .................. 10-2006-0017811

(51) Int. Cl.
*G06F 1/16* (2006.01)

(52) U.S. Cl. .................. 361/679.21; 235/492; 428/327; 313/585

(58) Field of Classification Search ............... 428/840.2, 428/327, 328; 156/241; 313/582, 326, 584, 313/585; 235/492, 451; 361/679.05, 679.21, 361/679.27, 679.29
See application file for complete search history.

(56) References Cited

U.S. PATENT DOCUMENTS

| | | | |
|---|---|---|---|
| 6,522,069 B1* | 2/2003 | Hong et al. | 313/582 |
| 7,269,023 B2* | 9/2007 | Nagano | 361/752 |
| 7,451,934 B2* | 11/2008 | Takahashi et al. | 235/492 |
| 2004/0160186 A1 | 8/2004 | Cho et al. | |
| 2005/0212424 A1 | 9/2005 | Kwon et al. | |
| 2006/0019127 A1* | 1/2006 | Yamazaki et al. | 428/840.2 |
| 2007/0175579 A1* | 8/2007 | Otani et al. | 156/241 |

FOREIGN PATENT DOCUMENTS

| | | |
|---|---|---|
| CN | 1674201 | 9/2005 |
| JP | 2000-219852 | 8/2000 |
| JP | 2002-123181 | 4/2002 |
| JP | 2002-150954 | 5/2002 |
| JP | 2002-371138 | 12/2002 |

(Continued)

*Primary Examiner* — Hung V Duong
(74) *Attorney, Agent, or Firm* — McKenna Long & Aldridge LLP

(57) ABSTRACT

The present invention provides a display apparatus comprising a display panel; a heat radiating member provided behind the display panel; and a heat conductive adhesive sheet, which is disposed between the display panel and the heat radiating member, and is capable of absorbing an electromagnetic wave and of conducting heat, a heat conductive adhesive sheet for the display apparatus, and a process for preparing the same.

21 Claims, 3 Drawing Sheets

FOREIGN PATENT DOCUMENTS

| | | |
|---|---|---|
| JP | 2002-374092 | 12/2002 |
| JP | 2004-134604 | 4/2004 |
| JP | 2005-022365 | 1/2005 |
| KR | 10-2004-0055678 | 6/2004 |
| KR | 10-2005-0038270 | 4/2005 |
| KR | 10-2005-0095103 | 9/2005 |

* cited by examiner

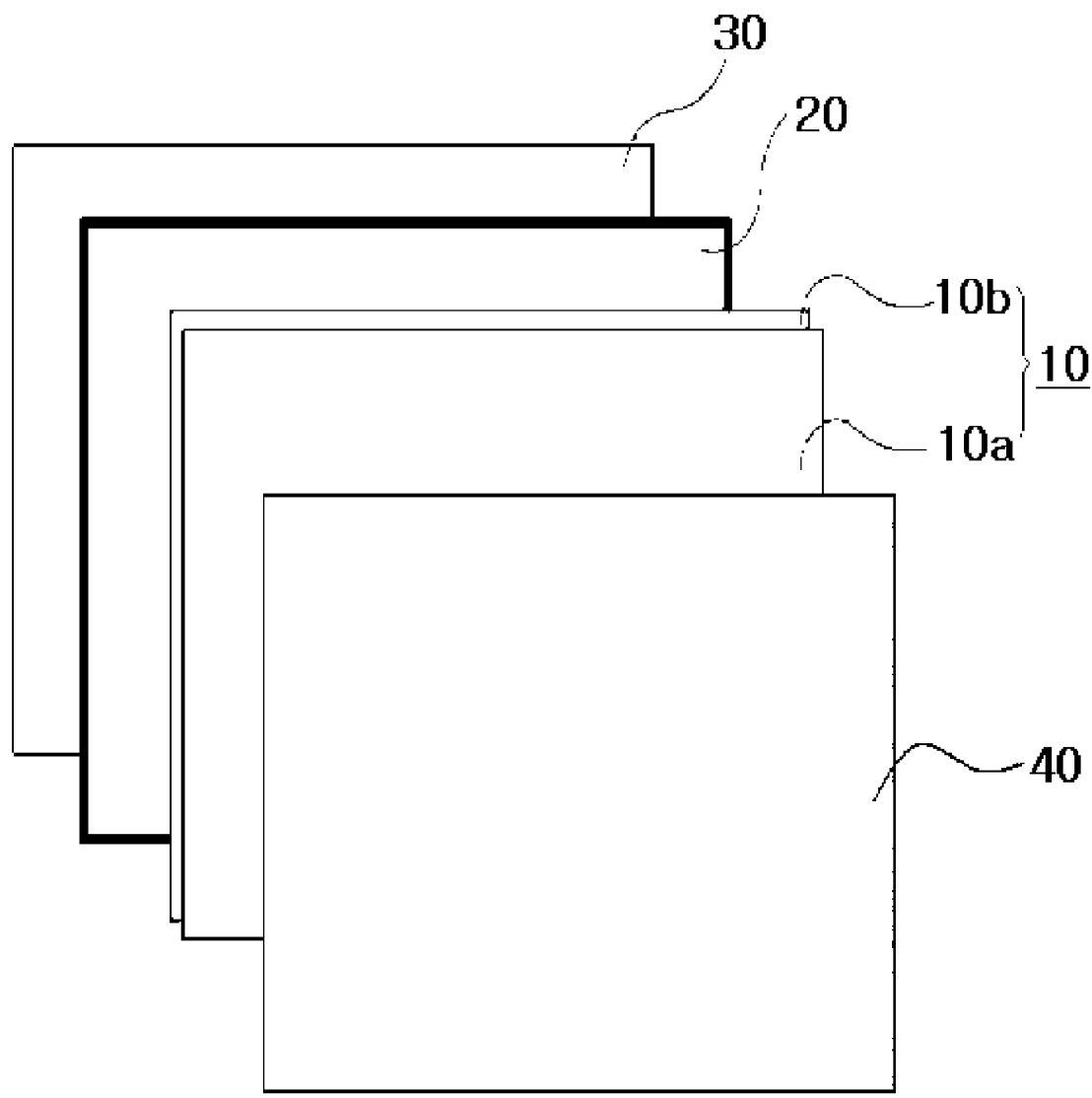
[Fig. 1]
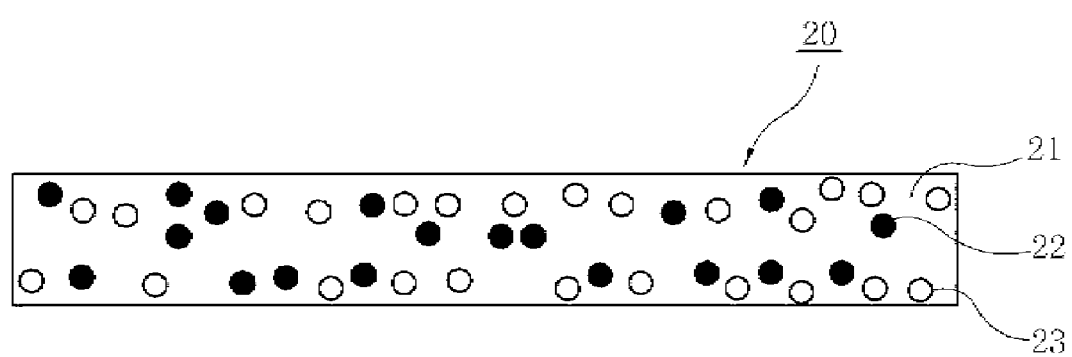
[Fig. 2]

[Fig. 3]
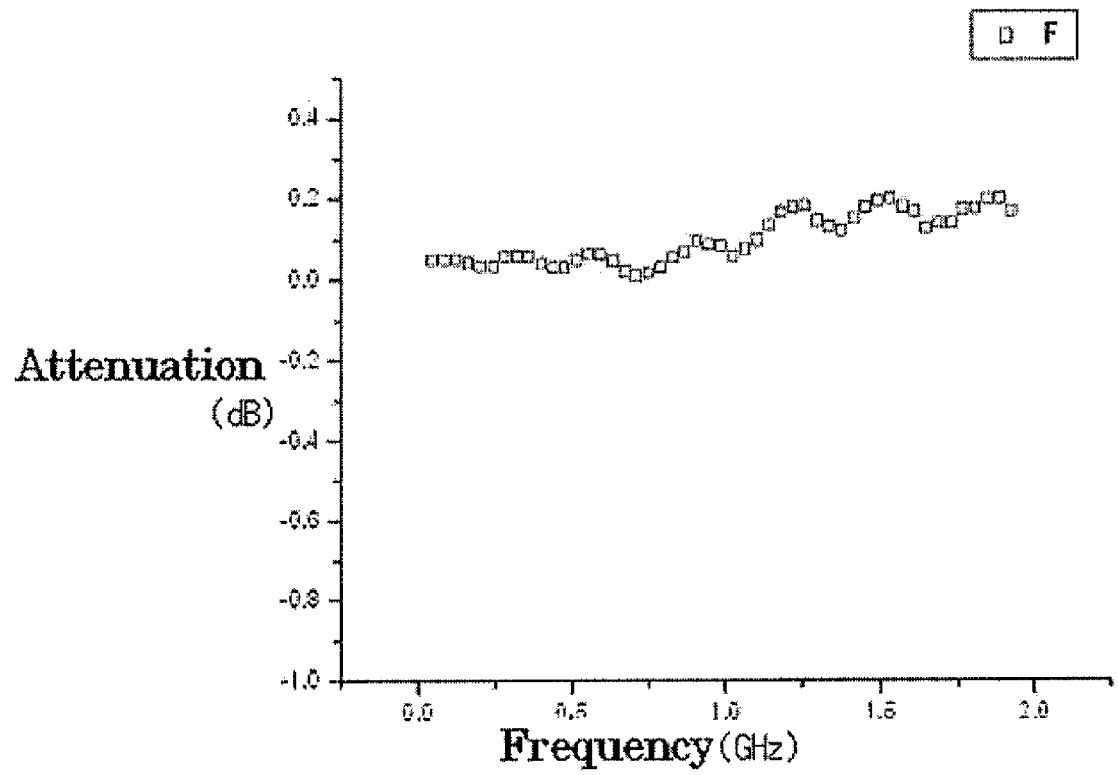
[Fig. 4]
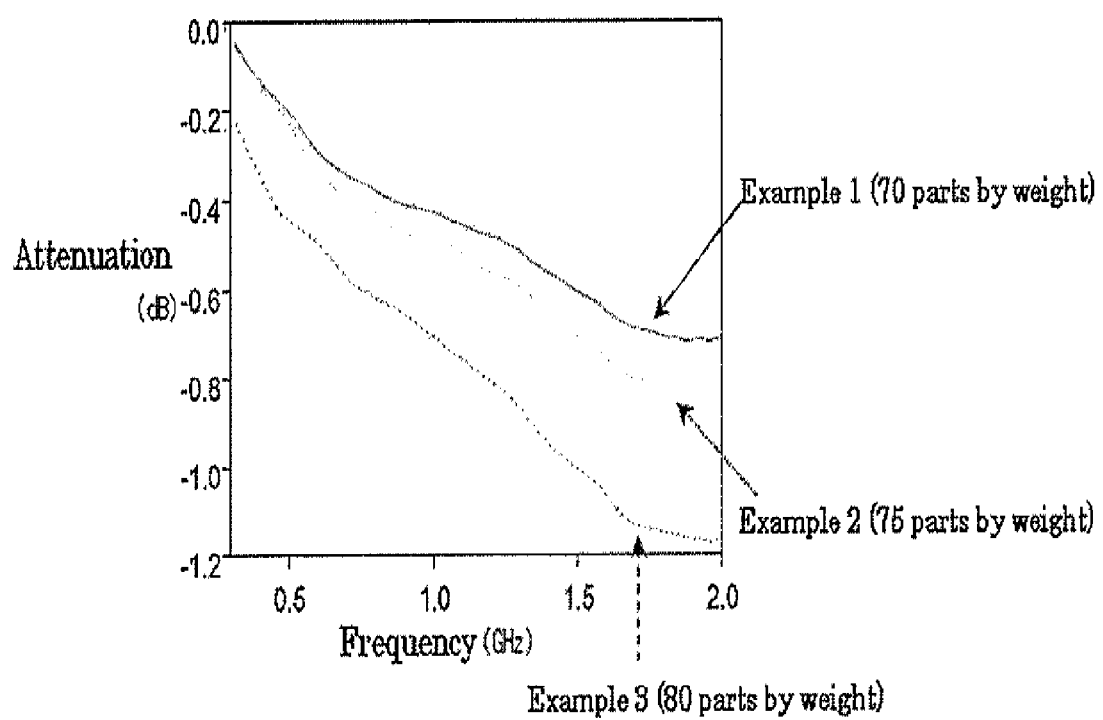

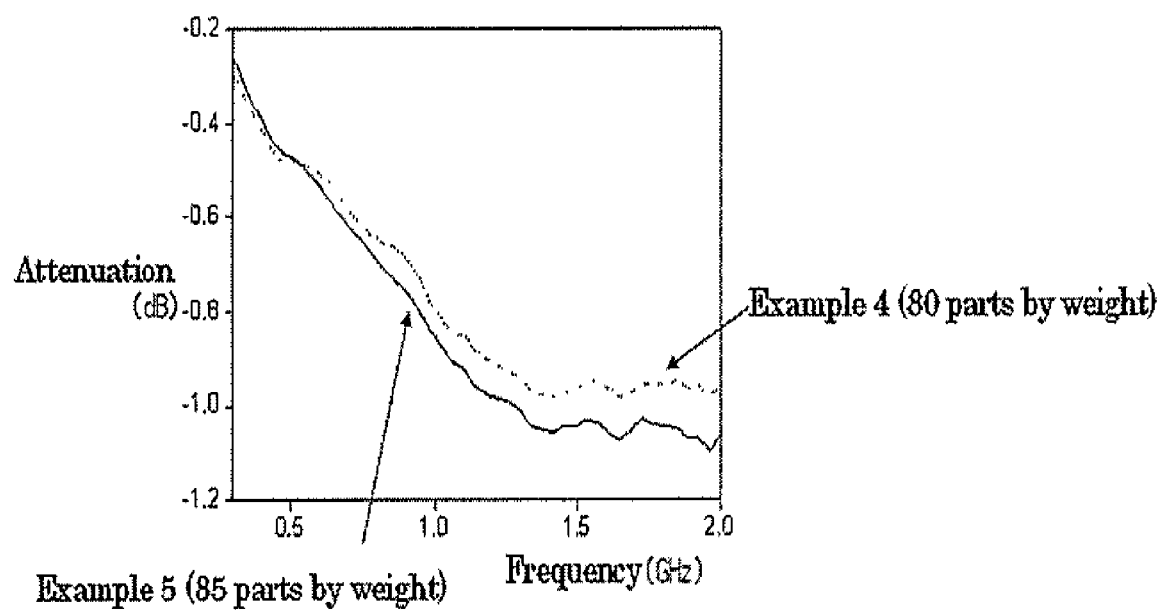
[Fig. 5]

DISPLAY APPARATUS, HEAT CONDUCTIVE ADHESIVE SHEET FOR DISPLAY APPARATUS, AND PROCESS FOR PREPARING THE SAME

This application is an application based on International Patent Application No. PCT/KR2007/000960 filed Feb. 23, 2007, which claims the benefit of Korean Application No. 10-2006-0017811 filed Feb. 23, 2006, which are hereby incorporated by reference for all purposes as if fully set forth herein.

TECHNICAL FIELD

The present invention relates to a display apparatus comprising a display panel; a heat radiating member; and a heat conductive adhesive sheet, which is disposed between the display panel and the heat radiating member, and is capable of absorbing an electromagnetic wave and of conducting heat, to a heat conductive adhesive sheet for the display apparatus, and to a process for preparing the same.

This application claims priority benefits from Korean Patent Application No. 10-2006-0017811, filed on Feb. 23, 2006, the entire content of which is fully incorporated herein by reference.

BACKGROUND ART

Generally, the term "display apparatus" comprehensively refers to monitors for TV, computers, or the like, and it includes a display panel such as CRT (Cathode Ray Tube), LCD (Liquid Crystal Display) and PDP (Plasma display Panel) for forming image.

Here, the display panel tends to be increased in its size according to the user's desire.

As one example of the display apparatus, Korean Patent Application Publication No. 2005-0038270 describes a plasma display apparatus including a plasma display panel, a front case for supporting the plasma display panel, and a back case. Herein, the front case is provided with a filter for shielding an electromagnetic wave radiated from the plasma display panel.

An aluminum chassis base is provided behind the plasma display panel, and a heat radiating sheet is provided between the plasma display panel and the aluminum chassis base. A circuit board for driving the plasma display panel is provided behind the aluminum chassis base.

Upon driving such plasma display apparatus, a large amount of an electromagnetic wave and heat is generated from the plasma display panel and the circuit board.

The electromagnetic wave generated from the plasma display panel and the circuit board is shielded by the filter provided in the front case.

Then, the heat generated from the plasma display panel is conducted to the aluminum chassis base through the heat radiating sheet, and discharged to the outside through the aluminum chassis base, and the heat generated from the circuit board is also conducted to the aluminum chassis base and discharged to the outside.

As such, in the conventional plasma display apparatuses, the heat radiating sheet disposed between the plasma display panel and the aluminum chassis base only functions to conduct heat, and thus it additionally requires a filter in the front case to shield the electromagnetic wave. Thus, it has problems that it lowers productivity, increases the production cost, and makes it difficult to give a slimmer appearance.

DISCLOSURE OF INVENTION

Technical Problem

It is an object of the present invention to provide a display apparatus which eliminates a need of an additional filter for shielding an electromagnetic wave, and comprises a heat conductive adhesive sheet capable of absorbing an electromagnetic wave and conducting heat between the display panel and the heat radiating member, a heat conductive adhesive sheet for the display apparatus, and a process for preparing the same.

Technical Solution

In order to overcome the above-described problems, one embodiment of the present invention provides a display apparatus comprising a display panel; a heat radiating member provided behind the display panel; and a heat conductive adhesive sheet, which is disposed between the display panel and the heat radiating member, and comprises an electromagnetic wave absorber and a heat conductive filler.

The display apparatus according to the present invention can further comprise a deposition type EMI (electromagnetic interference) shielding film provided in front of the display panel.

The deposition type EMI (electromagnetic interference) shielding film can be a sputtering type film obtained by a sputtering method. As one example thereof, mention may be made of an EMI (electromagnetic interference) shielding film formed by several sputtering processes using silver, but the kinds of the metals and the methods for forming a film are not limited thereto.

The deposition type EMI (electromagnetic interference) shielding film needs a low production cost, and has a function of shielding electromagnetic wave, as well as a near infrared ray (NIR). The function of shielding electromagnetic wave of the deposition type EMI (electromagnetic interference) shielding film may be less than that of a copper mesh type EMI (electromagnetic interference) shielding film, but in this case, by using an electromagnetic wave absorber included in the heat conductive adhesive sheet to overcome the problem, the effect of shielding electromagnetic wave can be enhanced.

On the deposition type EMI (electromagnetic interference) shielding film, at least one kind of the film selected from a color correction film, a near infrared ray shielding film, an anti-reflection film, and a transparent film can be laminated. Thus, there can be provided a film type optical filter, comprising at least one kind of the film selected from a color correction film, a near infrared ray shielding film, an anti-reflection film, and a transparent film, and the deposition type EMI (electromagnetic interference) shielding film. Herein, the film type optical filter has a reduced weight, and a reduced thickness, as compared to a glass type optical filter, whereby a weight-reduced, and slimmer display apparatus can be provided.

The display panel may be a plasma display panel.

If the display apparatus according to the present invention comprises a deposition type EMI (electromagnetic interference) shielding film and the display panel is a plasma display panel, the display apparatus according to the present invention can be consisted of the deposition type EMI (electromagnetic interference) shielding film, the plasma display panel, the heat conductive adhesive sheet, and the heat radiating member, in this order.

It is preferable that the heat radiating member is an aluminum chassis.

It is preferable that the heat conductive adhesive sheet has a thickness of 0.01 to 0.99 □.

It is preferable that the heat conductive adhesive sheet is prepared by dispersing an electromagnetic wave absorber and a heat conductive filler in a matrix, and then curing the matrix.

It is preferable that the matrix is at least one selected from an adhesive synthetic resin and a rubber.

It is preferable that the heat conductive filler is added in a content of 50 to 500 parts by weight based on 100 parts by weight of a liquid matrix. The heat conductive filler can be added in a content of 50 to 500 parts by weight based on 100 parts by weight of a liquid acrylic syrup, as one example of the liquid matrix.

The heat conductive filler can be a non-magnetic inorganic powder.

It is preferable that the non-magnetic inorganic powder is at least one selected from $Al(OH)_3$, $Al_2O_3$, $ZnO$ and $MnO$.

It is preferable that the electromagnetic wave absorber is contained in a content of 50 to 200 parts by weight based on 100 parts by weight of a liquid matrix. It is preferable that the electromagnetic wave absorber can be contained in a content of 50 to 200 parts by weight based on 100 parts by weight of a liquid acrylic syrup, as one example of the liquid matrix.

It is preferable that the electromagnetic wave absorber is at least one selected from a soft magnetic ferrite powder and a soft magnetic metal powder.

It is preferable that the soft magnetic ferrite powder is at least one selected from a Mn—Zn type ferrite, a Ni type ferrite, and a Mg—Zn type ferrite.

It is preferable that the soft magnetic metal powder is at least one selected from permalloy, sendust, ferrosilicon, permendur, pure iron and magnetic stainless steel.

In another embodiment of the present invention, a heat conductive adhesive sheet for a display apparatus is provided, which is disposed between a display panel and a heat radiating member, and comprises an electromagnetic wave absorber and a heat conductive filler. Herein, the same disclosure on the heat conductive adhesive sheet in the previous embodiment is true to the heat conductive adhesive sheet for the display apparatus.

The heat conductive adhesive sheet for the display apparatus can be positioned between the display panel and the heat radiating member, wherein a deposition type EMI (electromagnetic interference) shielding film is provided in front of the display panel.

In still another embodiment of the present invention, a method for preparing a heat conductive adhesive sheet for a display apparatus is provided, which comprises the steps of preparing a matrix; dispersing an electromagnetic wave absorber and a heat conductive filler in a matrix; and then curing the matrix in which the electromagnetic wave absorber and the heat conductive filler have been dispersed.

ADVANTAGEOUS EFFECTS

As discussed above, according to the present invention, the electromagnetic wave can be effectively reduced, and the heat can be rapidly transferred to the heat radiating member, which makes it possible to suppress misoperation of a system due to the electromagnetic wave and heat, and reduction in life time of the apparatus.

Further, slimmer appearances with reduced sizes can be established with no need of preparation of additional an electromagnetic wave absorbing sheet and a heat radiating sheet, as well as improved productivity and reduced production cost can be attained.

BRIEF DESCRIPTION OF THE DRAWINGS

FIG. 1 is an exploded view of the display module according to the present invention, FIG. 2 is a diagram illustrating the heat conductive adhesive sheet according to the present invention, FIG. 3 is a graph showing the relationship between the frequency of the electromagnetic wave and the attenuation in the electromagnetic wave of the heat conductive adhesive sheet according to Comparative Example 1, and FIGS. 4 and 5 are graphs showing the relationship between the frequency of the electromagnetic wave and the attenuation in the electromagnetic wave of the heat conductive adhesive sheet according to Examples 1 to 5 of the present invention.

REFERENCE NUMERALS

10a: Front substrate
10b: Rear substrate
10: Plasma display panel
20: Heat conductive adhesive sheet
21: Matrix
22: Electromagnetic wave absorber
23: Heat conductive filler
30: Aluminum chassis
40: Deposition type EMI (electromagnetic interference) shielding film

MODE FOR THE INVENTION

Hereinbelow, the present invention will be described in detail with reference to the accompanying figures.

The display apparatus according to one embodiment of the present invention comprises image forming display modules (10, 20, 30), and front and rear casings (not shown), which support the display modules (10, 20, 30), respectively.

Each of the display modules (10, 20, 30) comprises an image forming plasma display panel (PDP) (10), a deposition type EMI (electromagnetic interference) shielding film (40) disposed in front of plasma display panel (10), and aluminum chassis (30) as a heat radiating member disposed behind the plasma display panel (10), and a heat conductive adhesive sheet (20) disposed between the plasma display panel (10) and the aluminum chassis (30). Herein, a circuit board (not shown) for driving the plasma display panel (10) is provided behind the aluminum chassis (30). Upon operating the display modules (10, 20, 30, 40) having such structures, a large amount of electromagnetic wave and heat is generated from the plasma display panel (10) and the circuit board. Although the present invention is described with reference to the display modules (10, 20, 30, 40) having the plasma display panel (10), the present invention is not intended to be limited thereto. Thus, it is apparent that the present invention will be readily applied to display modules having various flat plate display panels including LCD.

The deposition type EMI (electromagnetic interference) shielding film (40) is disposed in front of the plasma display panel (10) to shield electromagnetic wave, and it can also shield near infrared ray (NIR).

The plasma display panel (10) is disposed at an interval from the front substrate (10a) and the front substrate (10a), and comprises a rear substrate (10b) forming a plasma discharge space.

The plasma display panel (10) is driven by the circuit board provided behind the aluminum chassis (30) for forming an image, and upon driving, a large amount of electromagnetic wave and heat is generated.

As such, in order to prevent the electromagnetic interference (EMI) due to the electromagnetic wave generated from the plasma display panel (10) and the circuit board, misoperation of the system due to the heat, and reduction in life time of the machine, a heat conductive adhesive sheet (20) is provided between the plasma display panel (10) and the aluminum chassis (30), which has a function of absorbing an electromagnetic wave, and a heat conduction function of absorbing heat and conducting the heat to aluminum chassis (30), and also an aluminum chassis (30) is provided behind the heat conductive adhesive sheet (20) to receive heat from the heat conductive adhesive sheet (20) and the circuit board, and then discharge the heat to the outside.

The heat conductive adhesive sheet (20) is prepared by dispersing the electromagnetic wave absorber (22) for absorbing an electromagnetic wave and heat conductive filler (23) for transferring the heat generated from the plasma display panel (10) to the aluminum chassis (30) in the matrix (21), and then curing the matrix by heat or an ultraviolet ray. Herein, the prepared heat conductive adhesive sheet (20) can have a thickness of more than 0 □ and less than 1 □, and preferably a thickness of 0.01 to 0.99 □.

As the heat conductive adhesive sheet (20) has such constitution, if the electromagnetic wave generated from the plasma display panel (10) or the circuit board is absorbed into heat conductive adhesive sheet (20) by the electromagnetic wave absorber (22), this electromagnetic wave energy is changed to heat energy, and this heat energy is rapidly transferred to the aluminum chassis (30) by the heat conductive filler (23) and then discharged. The heat generated upon driving the plasma display panel (10) is also rapidly transferred to the aluminum chassis (30) by the heat conductive adhesive sheet (20) and then discharged.

The matrix (21) should be adhesive enough to be adhered to the plasma display panel (10), and can be variously applied in a synthetic resin, a rubber, or the like. Since heat is generated upon driving the plasma display panel (10), it is most preferable that an acrylic synthetic resin and a silicone synthetic resin, each having heat resistance, are used.

As the electromagnetic wave absorber (22), a soft magnetic powder is used, and the soft magnetic powder can be contained in a content of 50 to 200 parts by weight based on 100 parts by weight of the liquid acrylic syrup.

If the content of the soft magnetic powder is less than 50 parts by weight, the function of absorbing an electromagnetic wave cannot be sufficiently performed, whereas if the content of the soft magnetic powder is more than 200 parts by weight, the adhesiveness of the matrix (21) is lowered.

As one example of the soft magnetic powder, either one of a soft magnetic ferrite powder and a soft magnetic metal powder can be selected and used, and a mixture of the soft magnetic ferrite powder and the soft magnetic metal powder can also be used.

Herein, since the soft magnetic ferrite powder and the soft magnetic metal powder have each characteristic, it is preferable that a suitable electromagnetic wave absorber (22) is selected according to the requirements.

The soft magnetic ferrite powder is used in the case of requiring insulation characteristics, it has a lower dielectric constant (a measurement of conductivity) than that of the soft magnetic metal powder, and thus a higher volume resistivity and less electrical wave reflection. That is, in the case of the soft magnetic ferrite powder, since the volume resistivity is high and thus electrical conductivity is low, it is advantageous for not shielding the electrical wave, but absorbing the electrical wave.

Examples of the soft magnetic ferrite powder include from a Mn—Zn type ferrite, a Ni type ferrite, and a Mg—Zn type ferrite, and among these, the Ni type ferrite having highest heat conductivity is most preferred.

Since the soft magnetic metal powder has a higher dielectric constant than that of the soft magnetic ferrite powder, and thus a lower volume resistivity and a higher electrical conductivity, it is advantageous for electrical wave reflection.

The soft magnetic metal powder has a higher effective permeability than that of the soft magnetic ferrite powder, as well as easily deforms the particle shape of the powder. Thus, the heat conductive adhesive sheet (20) according to the present invention containing the soft magnetic metal powder can shows a higher unreal part of a complex effective permeability, as compared to a predetermined frequency band. Herein, as the effective permeability is higher, the magnetic property is more prominent, and the unreal part of the complex effective permeability (which can be expressed with a real part and an unreal part) is a part showing a loss. Thus, as the unreal part of the complex effective permeability is higher, the loss as a heat after the absorption of the electromagnetic wave is larger.

As the soft magnetic metal powder the metal type, at least one selected from permalloy, sendust, ferrosilicon, permendur, pure iron and magnetic stainless steel can be used, and the particle shape of the powder can vary from a spherical shape to a flat plate shape.

For the heat conductive filler (23), a non-magnetic inorganic powder can be used, and examples thereof include $Al(OH)_3$, $Al_2O_3$, ZnO and MnO.

Since the non-magnetic inorganic powder has a higher heat conductivity than that of the matrix (21), it can provide a high heat conductivity for the heat conductive adhesive sheet (20) according to the present invention. The non-magnetic inorganic powder is added in a content of 50 to 500 parts by weight based on 100 parts by weight of a liquid matrix.

If the content of the non-magnetic inorganic powder is less than 50 parts by weight, a sufficient heat conductivity cannot be provided for the heat conductive adhesive sheet (20) according to the present invention, whereas if the content of the non-magnetic inorganic powder is more than 500 parts by weight, the adhesiveness of the heat conductive adhesive sheet (20) is lowered, and the hardness of the heat conductive adhesive sheet (20) is increased. Thus, the heat conductive adhesive sheet (20) cannot be sufficiently adhered to the plasma display panel (10), and the heat generated from the plasma display panel (10) cannot be sufficiently transferred to the heat conductive adhesive sheet (20), whereby the heat conductivity of the heat conductive adhesive sheet (20) is lowered.

Hereinbelow, Examples 1 to 5 according to the present invention, which have the above-described constitutions, and Comparative Example 1 will be described.

EXAMPLE 1

96 parts by weight of 2-ethyl hexyl acrylate and 4 parts by weight of acrylic acid as a polar monomer were thermally polymerized in a 1-liter glass reactor, to obtain a syrup having a viscosity of 3500 cP. Based on 100 parts by weight of the obtained syrup, 0.5 part by weight of Irgacure-651 (α,α-methoxy-α-hydroxyacetophenone) as a photopolymerization initiator, 0.5 part by weight of benzoyl peroxide (BPO) as a thermal polymerization initiator, and 0.35 part by weight of 1,6-hexanediol diacrylate (HDDA) as a crosslinking agent were mixed, and the stirred sufficiently. To the mixture, based on 100 parts by weight of the liquid acrylic syrup, 70 parts by weight of Ni—Zn ferrite as an electromagnetic wave absorber and 50 parts by weight of Al(OH)$_3$ as a heat conductive filler were added, and then stirred until the mixture is sufficiently homogeneous. This mixture was defoamed under reduced pressure using a vacuum pump. Later, an adhesive sheet has a thickness of more than 0 □ and less than 1 □ was prepared using a micro bar. Further, the adhesive sheet was cured by light radiation for 3 minutes using a UV lamp, and then left still in an oven at 100° C. for 5 minutes for complete curing, whereby a heat conductive adhesive sheet was obtained.

EXAMPLE 2

A heat conductive adhesive sheet was obtained in the same manner as in Example 1, except that 75 parts by weight of Ni—Zn was used as an electromagnetic wave absorber.

EXAMPLE 3

A heat conductive adhesive sheet was obtained in the same manner as in Example 1, except that 80 parts by weight of Ni—Zn was used as an electromagnetic wave absorber.

EXAMPLE 4

A heat conductive adhesive sheet was obtained in the same manner as in Example 1, except that 80 parts by weight of permalloy, which is a soft magnetic metal powder, was used as an electromagnetic wave absorber.

EXAMPLE 5

A heat conductive adhesive sheet was obtained in the same manner as in Example 1, except that 85 parts by weight of permalloy, which is a soft magnetic metal powder, was used as an electromagnetic wave absorber.

COMPARATIVE EXAMPLE 1

A heat conductive adhesive sheet was obtained in the same manner as in Example 1, except that an electromagnetic wave absorber was not used, and only 70 parts by weight of Al(OH)$_3$ as a heat conductivity medium was used.

The electromagnetic wave attenuation according to the content of the soft magnetic ferrite powder in the heat conductive adhesive sheet according to the present invention, was confirmed. To compare the attenuation with that in the case of the heat conductive adhesive sheet without an electromagnetic wave absorber, the electromagnetic wave attenuations of the heat conductive adhesive sheets obtained in Examples 1 to 5, and the heat conductive adhesive sheet obtained in Comparative Example 1 were measured by means of HP 8510C. As illustrated in FIG. 3, in Comparative Example 1, any electromagnetic wave attenuation effect was not shown, but as illustrated in FIGS. 4 and 5, in Examples 1 to 5 according to the present invention, electromagnetic wave attenuations according to the contents of the soft magnetic ferrite powder could be seen. That is, if the content of the soft magnetic ferrite powder is increased, the electromagnetic wave attenuation effect can be enhanced.

Meanwhile, the aluminum chassis (30) is a heat radiating member, which functions to rapidly receive the heat generated from the plasma display panel (10) to air by the heat conductive adhesive sheet (20). Specifically, the aluminum chassis (30) has one side in contact with the heat conductive adhesive sheet (20), and other sides exposed to air, and thus it can rapidly discharge the heat transferred from the heat conductive adhesive sheet (20).

The aluminum chassis (30) also functions to absorb the heat generated from the circuit board provided behind the aluminum chassis (30), and then rapidly discharge the heat to the outside.

In the display apparatus according to the present invention, the heat radiating member is prepared from an aluminum chassis (30), but for the heat radiating member, any metal having excellent heat radiating efficiency, such as gold, silver, and copper can be variously used, and its shape is not limited to a plate shape, or the like. Also, it can be prepared in various forms comprising a plurality of heat radiating pins on the heat insulating plate.

As such, since the display apparatus according to the present invention comprises a heat conductive adhesive sheet (20) which absorbs an electromagnetic wave between the plasma display panel (10) and the aluminum chassis (30), and transfers heat to aluminum chassis (30), it can effectively attenuate the electromagnetic wave, and rapidly transfer heat to the aluminum chassis (30), which could not be attained in Comparative Example 1 wherein an electromagnetic wave attenuation effect cannot be obtained due to absence of the electromagnetic wave absorber. Accordingly, it is possible to suppress misoperation of a system due to the electromagnetic wave and heat, and reduction in life time of the apparatus.

Further, slimmer appearances with reduced sizes can be established with no need of preparation of additional an electromagnetic wave absorbing sheet and a heat radiating sheet, as well as improved productivity and reduced production cost can be attained.

The invention claimed is:

1. A display apparatus comprising:
a display panel;
a heat radiating member provided behind the display panel; and
a heat conductive adhesive sheet, which is disposed between the display panel and the heat radiating member, and comprises an electromagnetic wave absorber and a heat conductive filler,
wherein the heat conductive adhesive sheet is prepared by dispersing an electromagnetic wave absorber and a heat conductive filler in a matrix, and then curing the matrix.

2. The display apparatus according to claim 1, which further comprises a deposition type EMI (electromagnetic interference) shielding film provided in front of the display panel.

3. The display apparatus according to claim 1, wherein the heat conductive adhesive sheet has a thickness of 0.01 to 0.99 mm.

4. The display apparatus according to claim 1, wherein the matrix is at least one selected from an adhesive synthetic resin and a rubber.

5. The display apparatus according to claim 1, wherein the heat conductive filler is added in a content of 50 to 500 parts by weight based on 100 parts by weight of the liquid matrix.

6. The display apparatus according to claim 1, wherein the heat conductive filler is a non-magnetic inorganic powder.

7. The display apparatus according to claim 6, wherein the non-magnetic inorganic powder is at least one selected from Al(OH)$_3$, Al$_2$O$_3$, ZnO and MnO.

8. The display apparatus according to claim 1, wherein the electromagnetic wave absorber is contained in a content of 50 to 200 parts by weight based on 100 parts by weight of the liquid matrix.

9. The display apparatus according to claim 1, wherein the electromagnetic wave absorber is at least one selected from a soft magnetic ferrite powder and a soft magnetic metal powder.

10. The display apparatus according to claim 9, wherein the soft magnetic ferrite powder is at least one selected from a Mn—Zn type ferrite, a Ni type ferrite, and a Mg—Zn type ferrite.

11. The display apparatus according to claim 9, wherein the soft magnetic metal powder is at least one selected from permalloy, sendust, ferrosilicon, permendur, pure iron and magnetic stainless steel.

12. A heat conductive adhesive sheet for a display apparatus which is disposed between a display panel and a heat radiating member, and comprises an electromagnetic wave absorber and a heat conductive filler,
wherein the heat conductive adhesive sheet for the display apparatus is prepared by dispersing an electromagnetic wave absorber and a heat conductive filler in a matrix, and then curing the matrix.

13. The heat conductive adhesive sheet for the display apparatus according to claim 12, wherein the heat conductive adhesive sheet for the display apparatus has a thickness of 0.01 to 0.99 mm.

14. The heat conductive adhesive sheet for the display apparatus according to claim 12, wherein the matrix is at least one selected from an adhesive synthetic resin and a rubber.

15. The heat conductive adhesive sheet for the display apparatus according to claim 12, wherein the heat conductive filler is added in a content of 50 to 500 parts by weight based on 100 parts by weight of the liquid matrix.

16. The heat conductive adhesive sheet for the display apparatus according to claim 12, wherein the heat conductive filler is a non-magnetic inorganic powder.

17. The heat conductive adhesive sheet for the display apparatus according to claim 16, wherein the non-magnetic inorganic powder is at least one selected from $Al(OH)_3$, $Al_2O_3$, ZnO and MnO.

18. The heat conductive adhesive sheet for the display apparatus according to claim 12, wherein the electromagnetic wave absorber is contained in a content of 50 to 200 parts by weight based on 100 parts by weight of the liquid matrix.

19. The heat conductive adhesive sheet for the display apparatus according to claim 12, wherein the electromagnetic wave absorber is at least one selected from a soft magnetic ferrite powder and a soft magnetic metal powder.

20. The heat conductive adhesive sheet for the display apparatus according to claim 19, wherein the soft magnetic ferrite powder is at least one selected from a Mn—Zn type ferrite, a Ni type ferrite, and a Mg—Zn type ferrite.

21. The heat conductive adhesive sheet for the display apparatus according to claim 19, wherein the soft magnetic metal powder is at least one selected from permalloy, sendust, ferrosilicon, permendur, pure iron and magnetic stainless steel.

* * * * *